(12) United States Patent
Naffziger

(10) Patent No.: US 7,239,494 B2
(45) Date of Patent: Jul. 3, 2007

(54) SYSTEM AND METHOD TO MITIGATE VOLTAGE FLUCTUATIONS

(75) Inventor: Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 685 days.

(21) Appl. No.: 10/653,760

(22) Filed: Sep. 3, 2003

(65) Prior Publication Data

US 2005/0047040 A1    Mar. 3, 2005

(51) Int. Cl.
    *H02H 9/00*    (2006.01)
(52) U.S. Cl. ................................... 361/91.1
(58) Field of Classification Search ............... 361/91.1
    See application file for complete search history.

(56) References Cited

U.S. PATENT DOCUMENTS

| | | | | |
|---|---|---|---|---|
| 5,283,631 A | | 2/1994 | Koerner et al. ............. 307/451 |
| 5,561,389 A | * | 10/1996 | Duley ........................ 327/143 |
| 5,612,645 A | * | 3/1997 | Halepete ..................... 327/537 |
| 5,874,830 A | | 2/1999 | Baker ......................... 323/316 |
| 5,963,023 A | | 10/1999 | Herrell et al. ............... 323/265 |
| 6,380,721 B2 | | 4/2002 | Pattamatta et al. .......... 323/269 |
| 6,525,586 B1 | * | 2/2003 | Ahmed et al. .............. 327/280 |
| 6,853,565 B1 | * | 2/2005 | Liao .......................... 363/56.11 |

OTHER PUBLICATIONS

Kwang-Ting (Tim) Cheng, et al., "Test Challenges for Deep Sub-Micron Technologies", DAC, pp. 1-8, 2000.
Thomas D. Burd, et al., "A Dynamic Voltage Scaled Microprocessor System", IEEE Journal of Solid-State Circuits, vol. 35, No. 11, pp. 1571-1580, Nov. 2000.
Sandeep Dhar, et al., "Closed-Loop Adaptive Voltage Scaling Controller For Standard-Cell ASICs", ISLPED, Aug. 2002.
Angel Peterchev and Jinwen Xiao, "Analog-to-Digital Converter for a Digital Voltage Regulator Controller", EE 347 Project, 2000.

* cited by examiner

*Primary Examiner*—Stephen W. Jackson

(57) ABSTRACT

A system and method can mitigate voltage fluctuations. According to one embodiment, a delay system provides a delayed version of a first reference signal as a function of a supply voltage. A comparator provides a control signal for controlling a protection device based on the delayed version of the first reference signal and a second reference signal. The amount of delay provided by the delay system defines a threshold based on which the comparator provides the control signal.

33 Claims, 6 Drawing Sheets

SYSTEM AND METHOD TO MITIGATE VOLTAGE FLUCTUATIONS

BACKGROUND

Power management and, in particular, voltage regulation has been recognized as an important consideration associated with the design and operation of VLSI (Very Large Scale Integration) chips. Consequently, various approaches exist to limit the amount of variation in the supply voltage. Examples of available approaches include the use of a coupling capacitance, dense power grid metal and active voltage regulation.

Existing voltage regulation approaches tend to focus on reducing voltage droop or undershoot. Limiting the amount of voltage droop is important since it impacts the maximum speed at which the VLSI device can operate. Because transistor speed is dependent on supply voltage, for example, a decrease in the supply voltage results in a corresponding reduction in the transistor switching speed, thus reducing the overall operating speed and performance of the VLSI device.

Another consideration in voltage regulation relates to voltage overshoot. Voltage overshoot, for example, occurs when operation of the chip is suddenly terminated, such that there is a sudden decrease in current consumption across the chip. By design, the power delivery system (e.g., the package and power grid), is inductive in nature and thus maintains current flow even though power is not being consumed at the same rate. Thus, an abrupt decrease in current consumption can cause a corresponding voltage spike or overshoot. The overshoot can cause damage to transistors such as through gate oxide wear out and punch through, for example. Accordingly, it is desirable to reduce overshoot and droop.

SUMMARY

According to one embodiment of the present invention, a delay system provides a delayed version of a first reference signal as a function of a supply voltage. A comparator provides a control signal for controlling a protection device based on the delayed version of the first reference signal and a second reference signal. The amount of delay provided by the delay system defines a threshold based on which the comparator provides the control signal.

Another embodiment of the present invention may comprise a system to mitigate temporary fluctuations in a supply voltage. The system includes at least one delay network that delays a first reference signal to provide a delay signal as a function of the supply voltage. A comparator provides a control signal based on a comparison of the delay signal relative to a second reference signal, the first reference signal being related to the second reference signal. A protection device implements temporary protection based on the control signal.

Yet another embodiment of the present invention may comprise a method for protecting an integrated circuit. The method may include delaying a first reference signal to provide a first delayed signal as a function of supply voltage. The first delayed signal is compared with a second reference signal to provide an indication of a level of the supply voltage. Protection can be implemented to mitigate at least one of an undervoltage or overvoltage condition based on the comparison between the first delay signal and the second reference signal.

DETAILED DESCRIPTION

The present invention relates generally to an approach that can be utilized to reduce voltage fluctuations, such as undershoot and/or overshoot (e.g., in an integrated circuit chip). A first reference signal (e.g., a clock signal or a delayed version of the clock signal) can be delayed as a function of a supply voltage. The delayed version of the reference signal is compared to a second reference signal to provide a control signal. For example, the control signal can be generated based on a phase difference between the delayed version of the first reference signal and the second reference signal itself The second reference signal can be the same or different from the first reference signal. A protection device can implement voltage protection (e.g., to substantially offset a voltage fluctuation) based on the control signal.

Figure 1:
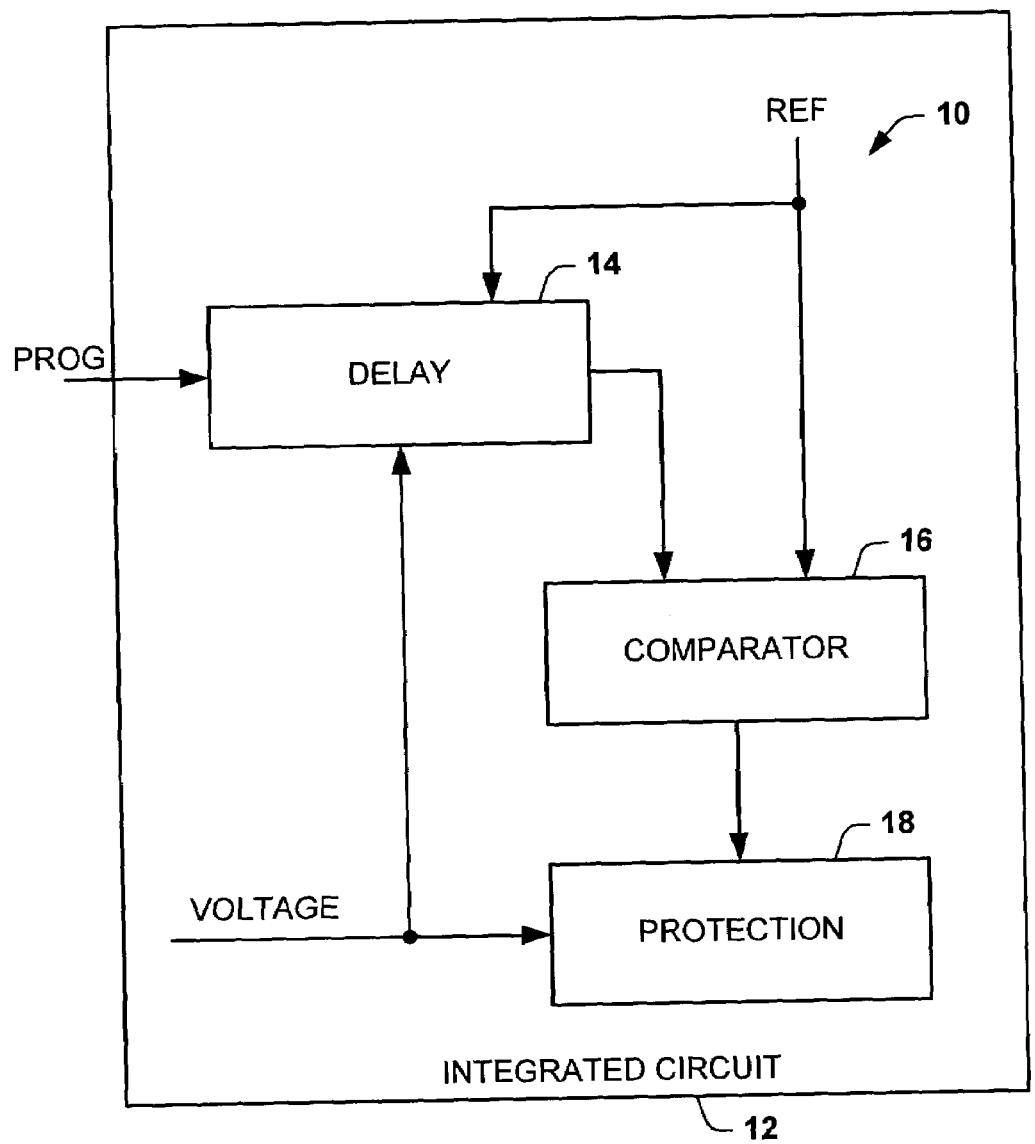
FIG. 1 depicts a block diagram of one embodiment of a protection system.

FIG. 1 depicts a block diagram of a system 10 that can be utilized to reduce temporary voltage fluctuations. The system 10 is illustrated as being part of an integrated circuit (IC) chip 12, such as a VLSI chip (e.g., a microprocessor). In the example of FIG. 1, the system 10 includes a delay network 14 that receives a voltage as one input and a reference signal REF as another input. The voltage, for example, corresponds to a supply voltage (e.g., $V_{DD}$) for the integrated circuit 12. Those skilled in the art will appreciate that such voltage can be provided by an associated power grid or other associated circuitry, which can be internal and/or external to the chip 12.

The reference signal REF, for example, corresponds to a clock signal for the IC chip 12. Alternatively, the reference signal REF that is provided to the delay network 14 can be a delayed version thereof, such as may be used by an associated frequency synthesis path (not shown). The delay network 14 provides a delayed version of the reference signal REF to a comparator 16. The comparator 16 compares the delayed version of the reference signal with the reference signal REF. The comparator 16 provides a control signal to a protection device 18 based on the comparison. The control signal indicates whether the supply voltage is at a level associated with a protection condition (e.g., undershoot or overshoot). The protection device 18 is operative to implement desired protection for the IC chip 12 based on the control signal.

In the case of implementing of overvoltage protection, the device 18 is operative to reduce the voltage of the IC 12 based on the control signal provided by the comparator 16.

For example, the protection device 18 can be configured (e.g., as a current source) to generate a predetermined amount of current based on the control signal from the comparator 16 that shunts from the voltage supply to a lower potential. By generating (or shunting) such current, the voltage of the IC 12 can be reduced. Alternatively, in the case of implementing voltage droop protection, the device 18 can be programmed and/or configured to stall operation of the chip (e.g., by stretching the cycle time) temporarily. By implementing a temporary stall of chip operation, the voltage will rise accordingly due to the decreased power consumption during the stall. Those skilled in the art will appreciate various examples when it may be desirable to implement such protection.

To reduce the likelihood of erroneously activating the protection device 18, the delay network 14 can implement an amount of delay that sets a desired threshold for activating the protection device. The threshold can be fixed or variable. The amount of delay implemented by the delay network 14 for the nominal voltage can be programmable based on a program signal PROG. The program signal PROG, for example, is a one or more bit word that is utilized to selectively set the amount of delay at a predefined nominal voltage. The PROG signal can implement the desired amount of delay by connecting or disconnecting components from the delay network 14. The amount of delay implemented by the delay network 14 defines a threshold voltage that limits activation of the protection device 18 to circumstances when the comparator 16 determines that the threshold has been crossed. For example, the program signal PROG can tune the delay to any value greater than any one clock cycle to implement overvoltage protection or to any value less than one clock cycle to implement droop protection.

The comparator 16 can be implemented as a phase comparator that compares the delayed signal and the reference signal REF. As mentioned above, the delay network 14 delays the reference signal REF with a delay that varies as a function of the input voltage. For example, the delay network 14 is tuned to provide a predetermined amount of delay for a predefined nominal voltage. If the input voltage exceeds the defined nominal voltage, the delay network 14 changes the amount of delay accordingly.

To provide overvoltage protection, for example, the amount of delay can be set to an amount greater than one clock cycle at the predefined nominal voltage. Thus, when the voltage is sufficiently high to cause the delay to decrease and, in turn, to lag behind the reference signal (e.g., indicating that threshold voltage has been crossed), the comparator 16 controls the protection device 18 to cause a reduction in the voltage.

Figure 2:
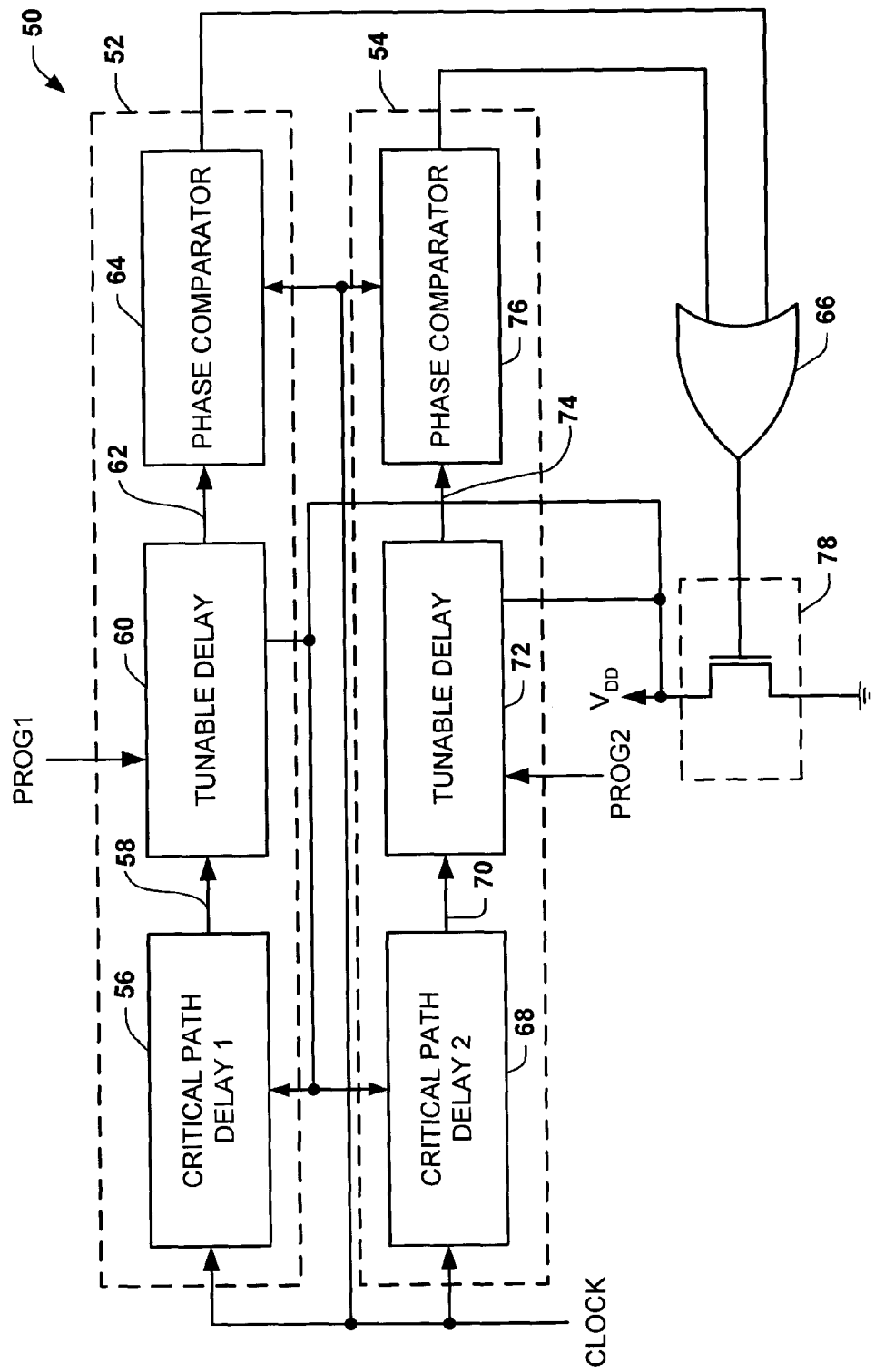
FIG. 2 depicts an example of a multi-path protection system.

FIG. 2 illustrates an example of another protection system 50. The protection system 50 includes a pair of detection networks 52 and 54. Each of the detection networks 52, 54 generates a corresponding control signal indicative of an overvoltage or undervoltage condition based on a clock signal (e.g., a chip clock signal of a VLSI system). The different detection networks 52 and 54 can be distributed at different locations on an IC. Additionally or alternatively, each network 52, 54 can be configured to detect a different type of behavior indicative of a condition in which protection may be desired, such as by responding differently to changes in a supply voltage $V_{DD}$.

In the example of FIG. 2, the detection network 52 includes a critical path delay network 56 that receives the clock signal and generates a corresponding delayed version of the clock signal at 58 based on a supply voltage $V_{DD}$. The critical path delay, for example, can be a delay network tuned to implement a delay of one clock cycle at a nominal supply voltage $V_{DD}$. The critical path delay network 56 is configured to implement a type and amount of delay that emulates operation of a critical path (e.g., critical path logic of the IC) over a clock cycle or a fractional part thereof. For example, the critical path delay network 56 is tuned to provide the signal at 58 in phase with (or matched to) the clock signal at the predefined nominal supply voltage $V_{DD}$. Alternatively, the critical path delay could be tuned to match a fractional part of the clock cycle.

A tunable delay network 60 receives the delayed signal from the critical path delay network 56. The delay network 60 is configured to implement a desired amount of delay on the signal at 58 as a function of the supply voltage $V_{DD}$ and to provide the delayed signal 62 to an associated phase comparator 64. That is, the delay network 56 provides the signal 62 having a delay indicative of the level of the supply voltage $V_{DD}$. The amount of delay defines a corresponding threshold voltage for $V_{DD}$ for triggering associated circuitry. The delay network 60 can be tuned (e.g., by a program signal or signals indicated at PROG1) to provide a delayed signal at 62 with a desired amount of delay at a nominal supply voltage $V_{DD}$. The amount of delay can be greater than or less than one clock cycle, depending on the type of protection being implemented by the system 50. The amount of delay also can vary according to whether the delay network 60 increases or decreases the delay in response to a corresponding increase or decrease in the supply voltage $V_{DD}$. The delay network 60 can implement a predetermined number of selectable delay values or, alternatively, the amount of the delay can be selected from a continuous range of delay values based on PROG1.

For example, to implement overvoltage protection where the delay network 60 decreases the delay in response to an increase in $V_{DD}$, the delay network 60 can be set (e.g., via PROG1) such that the sum of delay network 56 and delay network 60 implements a total amount of delay that is greater than one clock cycle (e.g., from 1 clock cycle up to about 1.3 times the clock cycle or more). Alternatively, the delay network 60 can be tuned such that the sum of delay network 56 and delay network 60 implements an amount of delay less than, but near a clock cycle (e.g., any amount less than one clock cycle down to about 0.7 times the clock cycle) to implement voltage droop protection. The phase comparator 64 compares the delayed signal at 62 with the CLOCK signal and provides a corresponding control signal to an OR gate 66 indicative of the voltage level at $V_{DD}$ relative to a corresponding threshold The other detection network 54 is similar to the network 52 just described. Briefly stated, the detection network 54 includes a critical path delay network 68 that provides a delayed version of the CLOCK signal at 70 to an associated tunable delay network 72. The critical path delay network 68 is programmed and/or configured to implement a delay of about one clock cycle (or a fractional part thereof) for a defined nominal supply voltage at $V_{DD}$. The critical path delay network 68 is designed to emulate operating characteristics of an associated critical path of the IC. Additionally, the second critical path delay network 68 can be configured to respond differently to changes in the supply voltage $V_{DD}$ than the critical path delay network 56 in the other detection network 52.

The tunable delay network 72 delays the signal at 70, such as that the delay at signal 74 is greater than or less than one clock cycle, this delayed signal at 74 is coupled to an associated phase comparator 76 indicative of a level of the supply voltage $V_{DD}$. The delay network 72 delays the signal at 70 as a function of the supply voltage $V_{DD}$. Similar to as mentioned above, the tunable delay network 72 can be programmable (e.g., via PROG1) to implement a desired amount of delay according to the type of protection and manner in which the delay is implemented. The amount of delay sets a corresponding threshold for triggering associated circuitry. For example, one of a predetermined number of selectable delay values can be set or, alternatively, the amount of the delay can be selected from a continuous range of delay values based on PROG2.

The phase comparator 76 compares the delayed signal at 74 with the CLOCK signal and provides a corresponding control signal to the OR gate 66. The control signal is an indicator of the level of the supply voltage $V_{DD}$ relative to the threshold. The OR gate provides an output signal to a protection device, indicated at 78. Thus, the current source 78 can be activated to generate current based on the control signals from either of the detection networks 52 and 54 to mitigate an overvoltage condition in the supply voltage $V_{DD}$.

In this example, the protection device 78 is depicted as a field effect transistor (FET) coupled between the supply voltage $V_{DD}$ and ground (or other low voltage) to operate as a current source. The current source 78 can be configured or calibrated to generate a predetermined amount of current based on the output signal from the OR gate 66. While in this example, the protection device 78 is depicted as including a single FET, it is to be understood and appreciated that a system 50 can include one or more current sources or otherwise enable the current source to generate a variable amount of current.

For example, the current source 78 can be configured to generate an amount of current based on the program signals PROG1 and PROG2 provided to the respective tunable delay networks 60 and 72. In this way, the amount of current being generated by the current source 78 in response to detecting an overvoltage condition can be functionally related to the amount of delay (or the voltage threshold) implemented by the detection networks 52 and 54. Thus, a greater amount of overvoltage at $V_{DD}$ can result in a larger amount of current being generated by the protection device 78, which results in corresponding greater reduction in the supply voltage $V_{DD}$. While the example of FIG. 2 illustrates the system configured to implement overvoltage protection, it is to be understood that other types of protection (e.g., undervoltage protection) can also be implemented within the scope of the present invention.

As mentioned above, the critical path delay networks 56 and 68 may be configured to respond differently to changes in the supply voltage $V_{DD}$ (e.g., by utilizing different components to provide the corresponding delay). For example, each delay network 56, 68 can emulate operating characteristics of different critical path logic paths, such that different delay characteristics can be achieved for the same changes in $V_{DD}$. Thus, because of the different potential responses by the critical path delay networks 56 and 68 to changes in $V_{DD}$, the protection will be implemented based on which detection network 52 or 54 first causes its associated phase comparator to trigger the protection device. Additionally, the protection device will remain activated according to which detection network 52 or 54 remains in the protection mode the longest based on the supply voltage $V_{DD}$. In this way, the extent of protection can further vary based on how changes in $V_{DD}$ affect the critical path represented by the critical path delay networks 56 and 68. Additionally, while two protection paths are illustrated in FIG. 2, it will be appreciated that any number of such paths can be implemented, such as one or more paths for each critical path in the IC.

Figure 3:
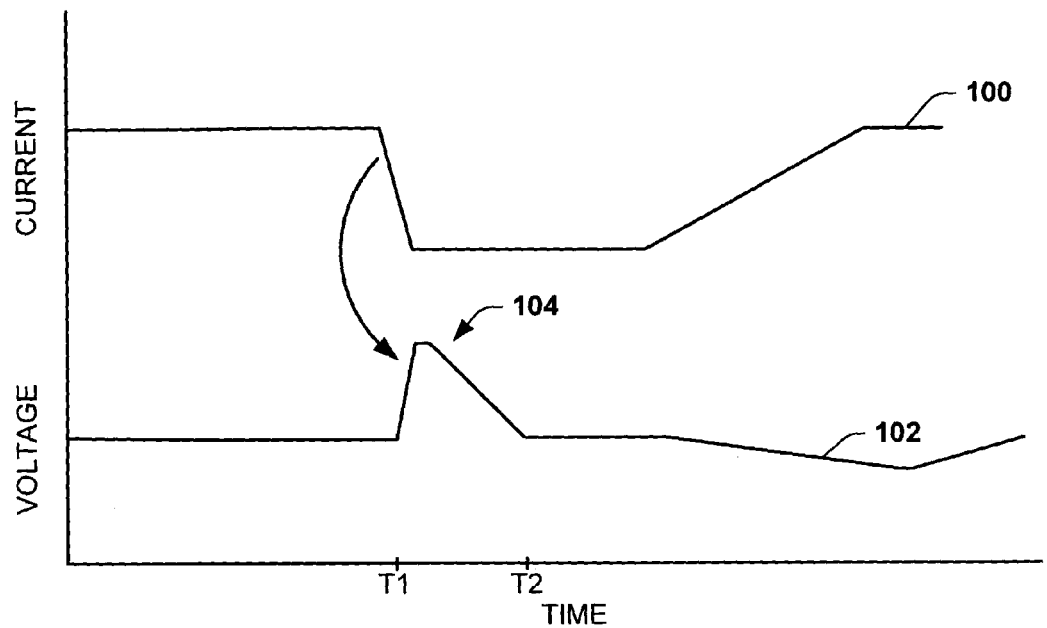
FIG. 3 depicts a graph illustrating voltage and current waveforms in the absence of a protection device.

By way of further example, FIG. 3 is a graph depicting chip current consumption 100 and chip supply voltage (e.g., $V_{DD}$) 102 both as a function of time in the absence of a protection system implemented in accordance with an embodiment of the present invention. As shown in FIG. 3, the current consumption 100 is substantially constant until about time T1, when there is a sudden drop in current consumption. This decrease in current consumption results in a corresponding voltage fluctuation or spike 104 due the inductive nature of the chip power system. Thus, in this example, the chip voltage 102 is at its nominal desired level until about time $T_1$ in which the voltage spike 104 occurs. The spike 104 lasts until about time $T_2$. In the absence of implementing protection to mitigate the spike 104, over an extended period of time repeated fluctuations (e.g., spikes or droop) might cause damage to the associated IC, such as through gate oxide wear out and punch through.

Figure 4:
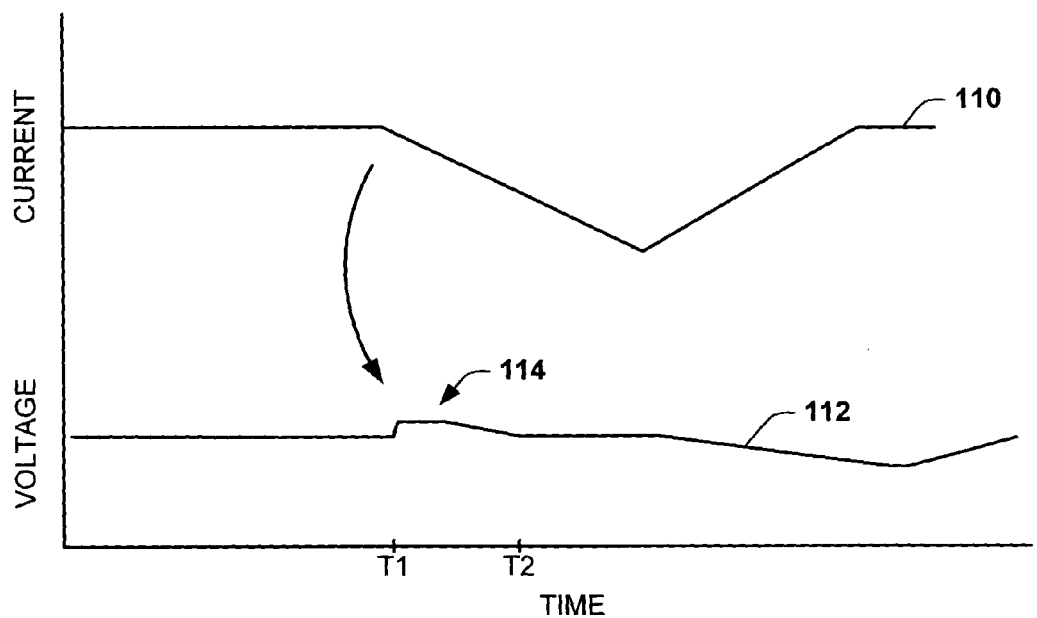
FIG. 4 depicts an example of voltage and current waveforms similar to those of FIG. 3 when protection is implemented.

FIG. 4 illustrates an example of chip current consumption 110 and chip supply voltage 112 as a function of time in an IC chip implementing a protection system according to the present invention. For purposes of comparison, the same time values T1 and T2 are utilized in FIG. 4 to refer to same types of events as in FIG. 3. Thus, in this example, at time $T_1$ a sudden drop in current consumption occurs. However, protection is implemented (e.g., to shunt excess current from the power supply to ground) resulting in a less abrupt decrease in current consumption 110 beginning at $T_1$ compared to the example of FIG. 3. As shown in FIG. 4, the magnitude of the voltage spike 114 in FIG. 4 is reduced (e.g., flattened) compared to the spike 104 in FIG. 3. The reduction in the spike 114 is due to the detection of an overvoltage condition and shunting of current to ground to provide overvoltage protection. Those skilled in the art will understand and appreciate various ways in which such functionality could be implemented based on the teachings contained herein.

Figure 5:
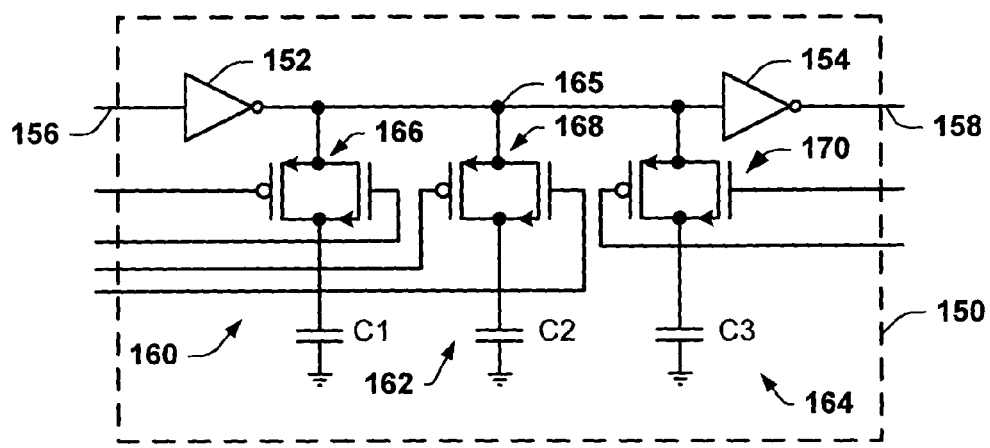
FIG. 5 depicts an example of a delay network.

FIG. 5 depicts an example of a tunable delay system 150 that can be implemented. In this example, the delay system 150 includes a pair of inverters 152 and 154 connected in series between the input 156 and output 158 of the delay system. To provide a desired amount of delay, the system 150 also includes capacitive networks 160, 162 and 164 connected to a node 165 interconnecting the inverters 152 and 154. Each capacitive network 160-164 includes a respective pass gate 166, 168 and 170 connected in series with an associated capacitor C1, C2, and C3 between the node 165 and ground. The pass gates 166-170 control which, if any, of the capacitors C1, C2, and C3 are connected into the system 150. For example, each of the pass gates 166-170 includes a pair of inputs that receive respective program signals to control coupling of the capacitors C1, C2, and C3 to the node 165.

The respective capacitors C1, C2, and C3 can be configured to have different capacitance values, which can be proportional to each other. For example, C1>C2>C3, such as C1=2*C2=4*C3. In this way, activation and deactivation of a desired combination of pass gates 166-170 (e.g., by employing a suitable program signal) can selectively connect a desired amount of capacitance into the respective delay system 150. Thus, in the example FIG. 5, the three capacitive networks 160-164 can provide up to eight different possible capacitance values. For example, a digital control word (e.g., three bits) can be provided to the respective inputs of the pass gates 166-170 to program a corresponding capacitance at the node 165. The amount of capacitance connected at the node 165, in turn, determines the amount of delay provided by the delay system 150.

Those skilled in the art will understand and appreciate various other control arrangements that can be utilized to select from the available capacitors C1, C2, and C3. Additionally, it will be appreciated that various arrangements can be utilized to provide a desired amount of capacitance in each of the respective capacitive networks 160-164. The type of delay network 150 depicted in FIG. 5 is but one example of system that can be employed to provide a delay for use in detecting a protection condition. Various other embodiments of delay (e.g., RC networks, transmission lines, etc.) can be implemented.

Figure 6:
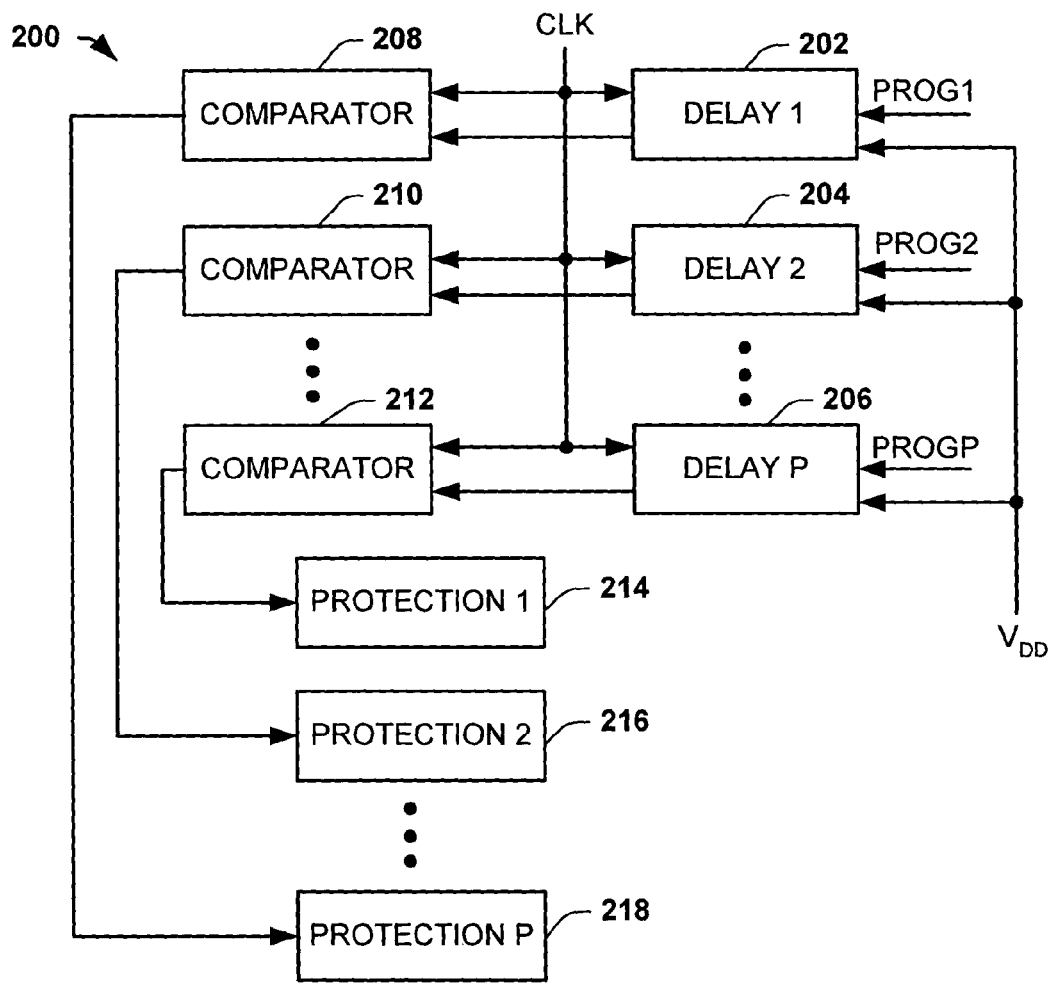
FIG. 6 depicts an example of another embodiment of a protection system.

FIG. 6 depicts an example of another protection system 200 than can be implemented. In this example, the system 200 includes a plurality of tunable delay networks 202, 204 and 206, indicated at DELAY 1, DELAY 2, and DELAY P, where P is a positive integer greater than or equal to two. Each delay network 202-206 receives a respective program signal indicated at PROG1, PROG2 and PROGP. The program signals are utilized to set the amount of delay implemented by each delay network 202-206. Each delay network can be configured to provide a selected amount of delay, which amount can be a selected one of a plurality of discrete delay values or within a range of continuous values based on the program signal.

In the example of FIG. 6, the respective delay networks 202-206 are configured to provide a corresponding delayed version of a clock signal CLK based on a supply voltage, indicated at $V_{DD}$. Alternatively, some or all of the delay networks can receive a delayed version of the clock signal CLK, such as from a critical path delay network (not shown) configured to implement a delay that emulates operating characteristics of critical path logic on the chip implementing the system 200. In this way, the protection can vary based on how fluctuations in $V_{DD}$ affect the critical path represented by the critical path delay networks 56 and 68.

Each of the delay networks 202-206 provides its delayed signal to an associated comparator 208, 210 and 212. The comparators 208-212 receive the clock signal CLK. While the same clock signal CLK is provided to the comparators 208-212, it is to be appreciated that different clock signals (e.g., as may be distributed across the chip at different locations) can be provided to the respective comparators. The comparators 208-212 provide respective control signals to associated protection devices 214, 216 and 218 based on a comparison of the delayed signals and the clock signal CLK, such that the control signals provided by the respective comparators indicates a condition of the supply voltage.

By way of example, each of the respective delay networks 202-206 can be configured to provide a different amount of delay to the clock signal CLK. In this way, each comparator 208, 210 and 212 is operative to control their respective protection devices 214, 216, and 218 for a different associated threshold of the supply voltage $V_{DD}$. Additionally, each protection device 214-218 can be configured to implement a different amount (and/or different type) of protection in the IC implementing the protection system 200. For example, different protection devices 214-218 can generate or shunt a different amount of current for overvoltage protection according to the level of the supply voltage $V_{DD}$. In this way, the system 200 can provide a variable amount of protection based on the amount of overvoltage associated with the supply voltage $V_{DD}$.

By way of further example, the delay network 202 implements a delay of 1.05 clock cycles, the delay network 204 implement the delay of 1.1 clock signals, and the delay network 206 implement the delay of 1.2 clock cycles. The total delay implemented by the delay networks 202-206 can be an aggregate amount of delay associated with multiple delays, for example. Thus, a greater amount of overshoot in $V_{DD}$ is required for the comparator 212 to detect an overvoltage condition than the other comparators 208 and 210. Similarly, the comparator 210 requires a greater amount of overshoot to activate its associated protection device 216 than the comparator 208 requires. It is to be understood and appreciated that activation of the associated protection devices 214-218 can be cumulative or, alternatively, activation of a protection device having a higher threshold can result in the deactivation of the other protection devices (e.g., by employing suitable logic).

An overvoltage protection system 200 can implement different delay networks and protection at various spaced apart locations distributed across an IC chip (e.g., a microprocessor) similar to the other example implementations shown and described herein. In this way, location dependent variations in the supply voltage $V_{DD}$ or the clock cycle can be detected and appropriate protection implemented. As an alternative or in addition to implementing overvoltage protection, one or more of the protection devices 214-218 can protect the IC from a droop in the supply voltage, such as by temporarily stalling operation of the chip during the droop condition.

Figure 7:
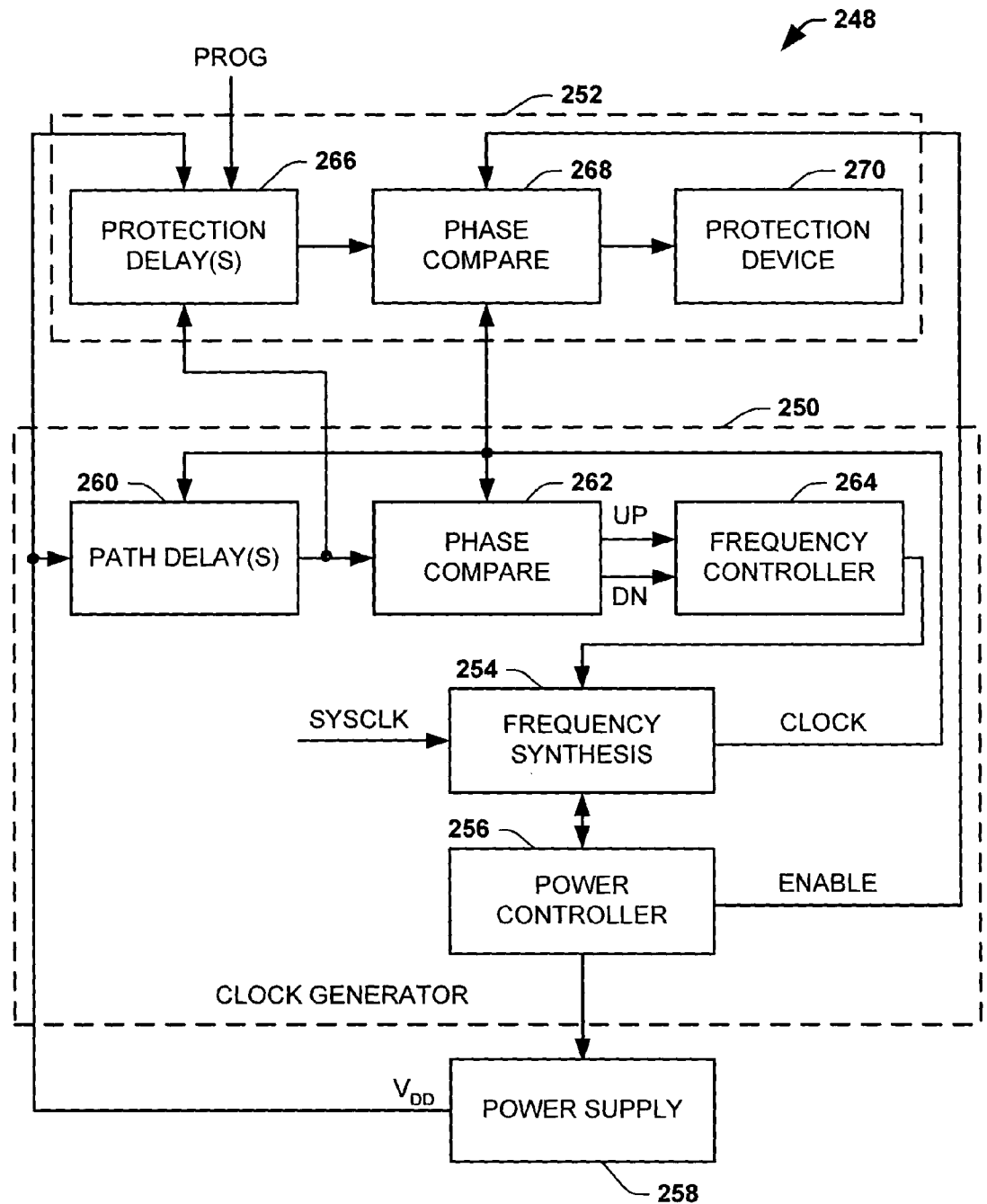
FIG. 7 depicts an example of an embodiment of a protection system implemented in conjunction with a clock generation system.

For purposes of context, FIG. 7 depicts an example of an IC 248 that includes a clock generator 250 and a protection system 252. The clock generator 250 includes a frequency synthesis path 254 that receives a system clock (SYSCLK) signal, such as can be generated off chip from the system 248. The frequency synthesis path 254 generates a CLOCK signal (e.g., a chip clock signal) for the IC chip that includes system 248. For example, the clock signal can correspond to a counter that increments at a desired frequency. The frequency synthesis path 254 is operative to adjust the clock cycle up or down based on a control signal. By way of example, the frequency synthesis path 254 can include a phase locked loop (PLL) and a frequency synthesizer. The frequency synthesis path 254 cooperates with a power controller 256 to control the clock cycle and supply voltage $V_{DD}$ for the IC chip. The CLOCK signal, for example, can cycle up and down in frequency associated with incrementing (or decrementing) a counter implemented as part of the frequency synthesis path 254.

The power controller 256 is coupled to an associated power supply 258, such as to implement an increase or decrease in the supply voltage based on changes to the CLOCK signal. The power supply 258 provides the chip supply voltage $V_{DD}$ based on a control signal from the power controller 256, which can be incrementally (e.g., one bit) adjusted each clock cycle. The power controller 256 also provides an ENABLE signal to the protection system 252. The ENABLE signal thus can be utilized to disable the protection system 252 in certain circumstances or modes, such as when the supply voltage is forced high or the clock cycle time is forced low (e.g., a reduction in frequency).

The clock generator 250 also includes one or more path delay networks 260 that receive the CLOCK signal from the frequency synthesis path 254. The path delay network 260 also receives a supply voltage $V_{DD}$ from the associated power supply system 258. The path delay network 260 provides a delayed version of the CLOCK signal to a phase compare block 262. The path delay network 260 is configured or tuned to emulate the cycle time for one or more associated critical paths implemented in the IC 248. For example, the path delay 260 can be tuned to match a one cycle clock delay at a defined nominal $V_{DD}$.

The phase compare block 262 compares the delayed clock signal from the path delay network 260 with the CLOCK signal from the frequency synthesis path 254. The phase compare block 262 provides one or more signals to a frequency controller 264 indicating whether the clock cycle should be incremented up or down. For example, the phase compare block 262 can include multiple phase comparators coupled to ascertain the phase difference between the CLOCK signal and one or more delayed clock signals. These comparisons provide an indication whether the clock cycle should be adjusted up or down. The frequency controller 264, in turn, provides the control signal to the frequency synthesis path 254 for adjusting the clock cycle (e.g., to stretch or shorten the cycle) accordingly. The frequency synthesis path 254 typically can implement only a one-bit adjustment (up or down) per cycle based on the control signal from the frequency controller 264. Consequently, the protection system 252 provides a useful approach to implement desired protection in the supply voltage, such as to mitigate overshoot or undershoot in $V_{DD}$.

The protection system 252 includes one or more protection delay networks 266. The delay network 266 is operative to provide a further delayed version of the output of the path delay network 258 as a function of the supply voltage $V_{DD}$. The delay network 266 provides the delayed signal to a phase compare block 268 that provides a protection control signal to one or more protection devices 270 according to the supply voltage. For example, the phase compare block 268 can include one or more phase comparators configured to drive the protection device 270 when the comparison indicates protection is appropriate, such as for an overshoot (or voltage spike) or undershoot (or voltage droop) in $V_{DD}$. The phase compare block 268 and activation of the protection device 270 can be enabled or disabled based on the ENABLE signal from the power controller 256 of the clock generator 250. Those skilled in the art will appreciate other approaches (e.g., an analog-to-digital converter on $V_{DD}$ relative to a fixed threshold voltage) that can be utilized to ascertain whether the supply voltage is too high or too low.

The amount of delay implemented by the delay network 266 can be programmable, such that the sum of delays implemented by delay network 256 and delay network 260 set a desired amount of delay based on a program signal PROG. The program signal PROG can be utilized to set a desired amount of delay for a defined nominal $V_{DD}$, which defines a threshold for enabling the phase compare block 268 to trigger the associated protection device 270. As mentioned above, the delay network 266 can implement multiple delay paths, each tuned to implement a different amount of delay on the signal from the path delay network 258. The amount of the delay thus can be programmed to set a desired voltage threshold relative to which protection can be activated, such as for an overvoltage or undervoltage condition. For a multiple delay path system 252, each path further can include its own phase comparator(s) for controlling an associated protection device.

Additionally, the protection device 270 can be configured to implement an amount of protection that can vary based on the amount of overvoltage or undervoltage at $V_{DD}$. By way of example, a protection delay network 266 having a greater amount of delay (e.g., about 0.2 times a clock cycle) can be associated with a large current source (or sources) operative to generate a large amount of current when its associated phase compare block 268 detects an overvoltage condition. Alternatively, a protection delay network 266 having a small amount of delay (e.g., about 0.05 times a clock cycle) can be associated with a current source that is configured to provide a proportionally smaller amount of current in an overvoltage condition. While the example of FIG. 7 has focused on implementing overvoltage protection, it will be appreciated that a similar approach can be utilized to provide undershoot protection based on the teachings contained herein. For example, the path delay 260 can be tapped into in the middle of its cycle delay to obtain an effective total delay of less than one cycle.

Figure 8:
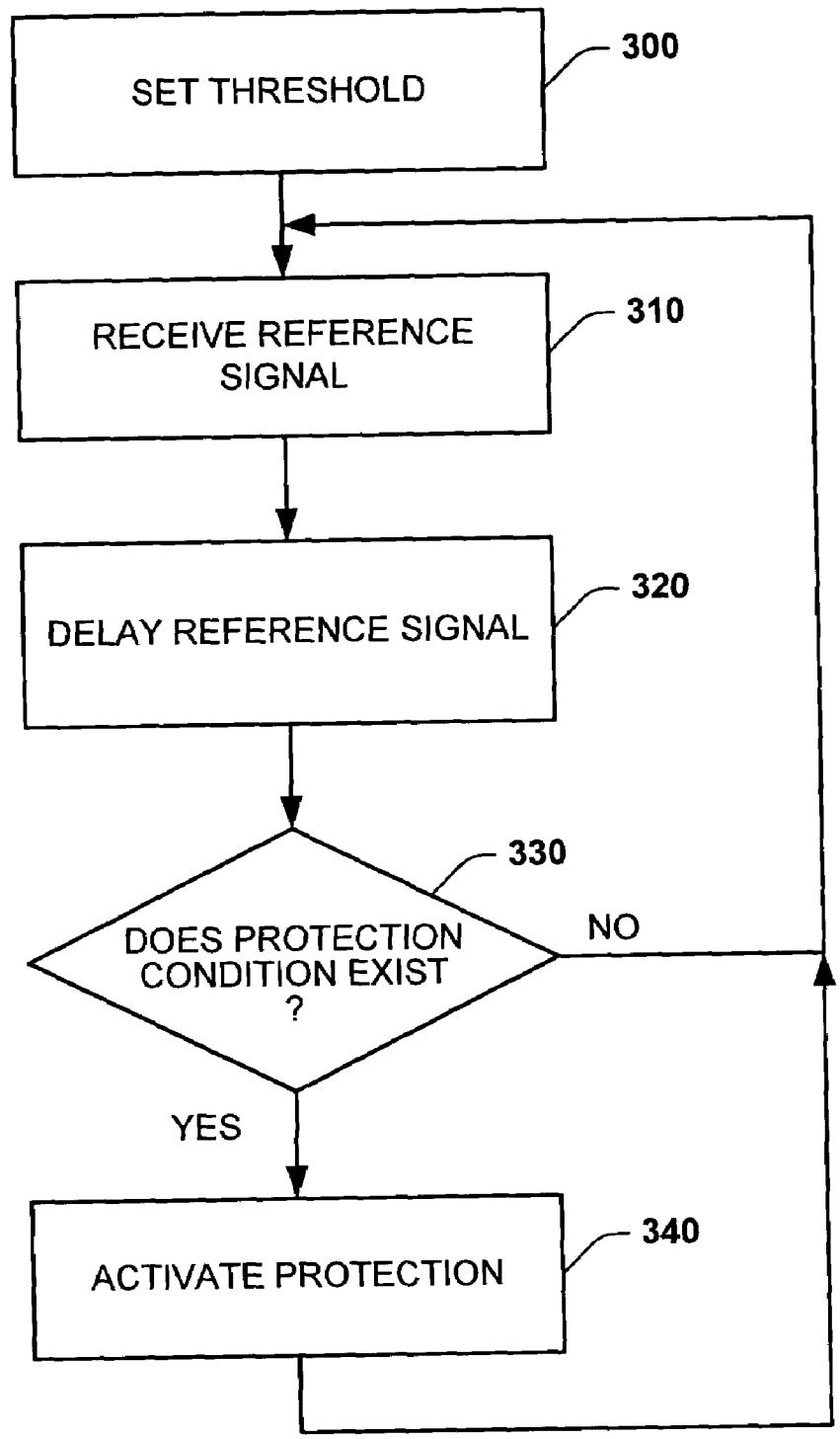
FIG. 8 is a flow diagram illustrating a protection methodology.

In view of the foregoing structural and functional features described above, a protection methodology will be better appreciated with reference to FIG. 8. While, for purposes of simplicity of explanation, the methodology of FIG. 8 is shown and described as being implemented serially, it is to be understood and appreciated that the illustrated actions, in other embodiments, may occur in different orders and/or concurrently with other actions. Moreover, not all illustrated actions may be required to implement a methodology. It is to be further understood that the following methodology can be implemented in hardware, such as one or more integrated circuits, software, or any combination thereof.

FIG. 8 illustrates an example of a methodology that can be utilized to implement protection of associated circuitry. While for purposes of simplicity of explanation, much of the following describes implementing protection during temporary voltage spike or overvoltage condition, the methodology is equally applicable to protection during an undervoltage or voltage droop condition.

The methodology begins at 300 in which a voltage threshold is set. The threshold voltage can be set, for example, by implementing a desired amount of delay on a reference signal, such as a chip clock signal. The amount of delay can be fixed or variable to define the desired threshold voltage. For example, the delay can be greater than one clock cycle or less than one clock cycle, depending at least in part on the type of protection. From 300 the methodology proceeds to 310.

During operation of the methodology in an IC, at 310, a reference signal is received. The reference signal can alternate between normally high and normally low levels at a desired frequency, such as determined by a system clock signal. For example, the reference signal can be a clock signal or a delayed version of the clock signal that is matched to the cycle of the clock signal (e.g., any fractional or whole portion thereof) for a defined nominal supply voltage. At 320, the reference signal is delayed according to the delay at 300. Those skilled in the art will understand and appreciate various approaches that can be utilized to implement the desired amount of delay on the reference signal.

At 330, a determination is made as to whether a protection condition exists. This determination can be enabled or disabled depending on, for example, the operating mode of the chip implementing the methodology. For instance, the determination can be made by comparing the phase of the delayed signal at 320 with that of a clock signal. Alternatively, the delayed signal provided at 320 can be compared relative to another signal, such as one substantially matched to the clock cycle of the reference signal at some nominal supply voltage (e.g., the reference signal at 310). If the determination at 330 indicates that an overvoltage does not exist, the methodology can loop between 310, 320 and 330 for the associated conditions in the next clock cycle. If an overvoltage condition exists, the methodology proceeds from 330 to 340 in which one or more associated protection devices are activated. For example, overvoltage protection can be implemented by generating or shunting current from the supply voltage to ground or another lower potential.

In an example methodology implementing overvoltage protection, if the supply voltage is greater than the nominal voltage, the delay implemented at 320 can be reduced as a function of the supply voltage. Thus, the comparison at 330 can detect an overvoltage condition in a situation where the delayed signal at 320 lags behind the clock signal or other signal with which it is compared at 330. By programming the amount of delay at 300, a desired threshold voltage can be set so that the protection device is not activated unless a sufficiently high overshoot condition exists for the supply voltage. From 340 the methodology returns to 310 to repeat the foregoing steps for the next clock cycle. The methodology can be repeated indefinitely, such as for each clock cycle during operation of an associated IC chip to help limit overvoltage or undervoltage conditions.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for reducing voltage fluctuations comprising:
   a delay system comprising a tunable delay network configured to delay the first reference signal an amount that varies as a function of a supply voltage, the delay system provides a delayed version of a first reference signal as a function of the supply voltage; and
   a comparator that provides a control signal for controlling a protection device based on the delayed version of the first reference signal and a second reference signal, an amount of delay provided by the delay system defining a voltage threshold based on which the comparator provides the control signal.

2. The system of claim 1, the amount of delay being programmable to set a threshold based on a program signal.

3. The system of claim 1, the second reference signal comprising a clock signal, the system further comprising a critical path delay network that delays the clock signal to provide the first reference signal, the comparator provides the control signal based on the first reference signal and the clock signal.

4. The system of claim 1, further comprising:
   a first critical path delay tuned to delay a clock signal to provide a delay signal as a function of the supply voltage emulating operation of a first critical path of an integrated circuit;
   a first tunable delay network configured to delay the delay signal provided by the first critical path delay to provide a corresponding delay signal as a function of the supply voltage; and
   the comparator determines an indication of the supply voltage based on a comparison between the clock signal and the corresponding delay signal provided by the first tunable delay network.

5. The system of claim 4, further comprising:
   at least a second critical path delay tuned to delay a clock signal to provide a delay signal as a function of the supply voltage emulating operation of a second critical path of the integrated circuit;
   a second tunable delay network configured to delay the delay signal provided by the second critical path delay to provide a corresponding delay signal as a function of the supply voltage; and
   the comparator determines an indication of the supply voltage based on comparisons between the clock signal and each of the corresponding delay signals provided by each of the first and second tunable delay networks.

6. The system of claim 5, the comparator further comprising a phase comparator that provides the control signal based on a comparison of a phase of the delayed version of the first reference signal relative to a phase of the second reference signal.

7. A protection system comprising:
   a system for reducing voltage fluctuations comprising:
      a delay system that provides a delayed version of a first reference signal as a function of a supply voltage; and
      a comparator that provides a control signal for controlling a protection device based on the delayed version of the first reference signal and a second reference signal, an amount of delay provided by the delay system defining a voltage threshold based on which the comparator provides the control signal; and comprising a protection device that mitigates fluctuations in the supply voltage of an associated integrated circuit based on the control signal from the comparator.

8. The protection system of claim 7, the protection device further comprising at least one device coupled to shunt current from the supply voltage based on the control signal.

9. The protection system of claim 7, the protection device is configured to provide an amount of protection that varies as a function of the supply voltage relative to the threshold.

10. The protection system of claim 7, the delay system is programmable to set an amount of delay that defines a threshold for triggering the protection device based on the level of the supply voltage.

11. The protection system of claim 7, the protection device being configured to implement at least one of undervoltage and overvoltage protection based on the control signal.

12. An integrated circuit comprising the protection system of claim 7.

13. A system to mitigate temporary fluctuations in a supply voltage, comprising:
    at least one delay network that delays a first reference signal to provide a delay signal as a function of the supply voltage;
    a comparator that provides a control signal based on a comparison of the delay signal relative to a second reference signal, the first reference signal being related to the second reference signal; and
    a protection device that implements temporary protection based on the control signal to mitigate temporary fluctuations in the supply voltage.

14. The system of claim 13, the at least one delay network further comprising a tunable delay network that delays the first reference signal a desired amount based on a program signal, the desired amount of delay defines a threshold relative to which the comparator provides the control signal to control the protection device.

15. The system of claim 13, the second reference signal corresponding to a clock signal, the system further comprising a critical path delay network that provides the first reference signal as a delayed version of the clock signal, the comparator provides the control signal based on the clock signal relative to the delay signal provided by the at least one delay network.

16. The system of claim 13, further comprising:
a plurality of critical path delay networks, each tuned to emulate operation of an associated critical path and to provide a corresponding delayed version of the second reference signal as a function of the supply voltage;
a plurality of tunable delay networks, at least one associated with each of respective one of the plurality of critical path delay networks that is tuned to further delay the delayed version of the second reference signal provided by the associated critical path delay network and provide a respective delay signal as a function of the supply voltage.

17. The system of claim 16, the comparator further comprising a comparator associated with each of the plurality of tunable delay networks, each comparator providing a control signal to control the protection device based on a comparison between the second reference signal and the respective delay signal provided by the associated tunable delay network.

18. The system of claim 13, the protection device further comprising at least one device coupled to shunt current from the supply voltage to a lower potential based on the control signal.

19. The protection system of claim 13, the protection device provides an amount of protection that varies as a function of the supply voltage relative to a threshold.

20. The protection system of claim 13, the protection device being configured to implement at least one of undervoltage and overvoltage protection based on the control signal.

21. The protection system of claim 13, the comparator further comprises a phase comparator that provides the control signal based on a comparison of a phase of the delay signal relative to a phase of the second reference signal.

22. An integrated circuit comprising the protection system of claim 13.

23. A protection system comprising:
means for providing a signal indicative of a level of a supply voltage based on a clock signal; and
means for detecting a protection condition based on the signal indicative of the level of a supply voltage relative to a threshold; and
means for implementing protection of associated circuitry to substantially offset at least one of an undervoltage and overvoltage in the supply voltage based on the detection of a protection condition by the means for detecting.

24. The protection system of claim 23,
the means for providing further comprising means for delaying a first reference signal as a function of the supply voltage to provide a delay signal; and
the means for detecting further comprising means for comparing the delay signal relative to a second reference signal to provide an indication of a level of the supply voltage, each of the first reference signal and the second reference signal being provided based on the clock signal.

25. The protection system of claim 24, further comprising means for programming the means for delaying to define a threshold for the supply voltage, the means for detecting controls the protection device based on supply voltage relative to the threshold.

26. The protection system of claim 24, further comprising means for delaying the clock signal to provide a critical path delay signal associated with operation of a critical path, the critical path delay signal defining the first reference signal.

27. The protection system of claim 24, the clock signal defining the second reference signal, such that the means for detecting controls protection based on the clock signal relative to the delay signal provided by the means for delaying the first reference signal.

28. A method for protecting an integrated circuit, comprising:
delaying a first reference signal to provide a first delay signal as a function of supply voltage;
comparing the first delay signal with a second reference signal to provide an indication of a level of the supply voltage; and
implementing protection to mitigate at least one of an undervoltage or overvoltage condition of the supply voltage based on the comparison between the first delay signal and the second reference signal.

29. The method of claim 28, further comprising programming an amount of delay associated with the delaying of the first reference signal to define a corresponding threshold for the supply voltage.

30. The method of claim 28, further comprising delaying a clock signal by an amount functionally related to the supply voltage to provide the first delay signal, the amount of delay corresponding to operating characteristics of a critical path of the integrated circuit.

31. The method of claim 28, the implementation of protection being based on the first delay signal relative to a clock signal that defines the second reference signal.

32. The method of claim 28, the implementation of protection further comprising shunting current from the supply voltage to a lower potential based on the comparison of the first delay signal with the second reference signal.

33. The method of claim 28, the implementation of protection further comprising implementing an amount of protection that varies based on the supply voltage relative to a threshold, the threshold being defined by an amount of delay associated with the delaying of the first reference signal.

* * * * *

UNITED STATES PATENT AND TRADEMARK OFFICE
CERTIFICATE OF CORRECTION

| | | |
|---|---|---|
| PATENT NO. | : 7,239,494 B2 | Page 1 of 1 |
| APPLICATION NO. | : 10/653760 | |
| DATED | : July 3, 2007 | |
| INVENTOR(S) | : Samuel D. Naffziger | |

It is certified that error appears in the above-identified patent and that said Letters Patent is hereby corrected as shown below:

In column 5, line 4, delete "PROG1" and insert -- PROG2 --, therefor.

Signed and Sealed this

Nineteenth Day of August, 2008

JON W. DUDAS
*Director of the United States Patent and Trademark Office*